United States Patent
Kim et al.

(10) Patent No.: US 12,205,951 B2
(45) Date of Patent: Jan. 21, 2025

(54) COMPLEMENTARY METAL OXIDE SEMICONDUCTOR DEVICE

(71) Applicant: Samsung Electronics Co., Ltd., Suwon-si (KR)

(72) Inventors: Sangwook Kim, Seongnam-si (KR); Seunggeol Nam, Suwon-si (KR); Taehwan Moon, Suwon-si (KR); Kwanghee Lee, Hwaseong-si (KR); Jinseong Heo, Seoul (KR); Hagyoul Bae, Hanam-si (KR); Yunseong Lee, Osan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 361 days.

(21) Appl. No.: 17/491,841

(22) Filed: Oct. 1, 2021

(65) Prior Publication Data
US 2022/0173099 A1  Jun. 2, 2022

(30) Foreign Application Priority Data

Nov. 27, 2020  (KR) .................. 10-2020-0163331
Mar. 19, 2021  (KR) .................. 10-2021-0036078

(51) Int. Cl.
| | | |
|---|---|---|
| *H01L 27/092* | (2006.01) | |
| *H01L 29/24* | (2006.01) | |
| *H01L 29/51* | (2006.01) | |
| *H01L 29/78* | (2006.01) | |

(Continued)

(52) U.S. Cl.
CPC .......... *H01L 27/0922* (2013.01); *H01L 29/24* (2013.01); *H01L 29/516* (2013.01);
(Continued)

(58) Field of Classification Search
CPC ..................... H01L 27/0922; H01L 27/0688
See application file for complete search history.

(56) References Cited

U.S. PATENT DOCUMENTS 6,316,301 B1  11/2001  Kant
6,750,126 B1 *  6/2004  Visokay ............... H01L 29/513
                                              257/E21.267
(Continued)

FOREIGN PATENT DOCUMENTS

| JP | S61-251063 A | 11/1986 |
| JP | 2011-258760 A | 12/2011 |
| KR | 10-2015570 B1 | 1/2018 |

OTHER PUBLICATIONS

Univ. of Berkeley, EE105, Fall 2005, discussion 5, https://inst.eecs.berkeley.edu/~ee105/fa05/handouts/discussions/Discussion5.pdf (Year: 2005).*

(Continued)

*Primary Examiner* — Vincent Wall
(74) *Attorney, Agent, or Firm* — Harness, Dickey & Pierce, P.L.C.

(57) ABSTRACT

Provided is a semiconductor device including a first semiconductor transistor including a semiconductor channel layer, and a metal-oxide semiconductor channel layer, and having a structure in which a second semiconductor transistor is stacked on the top of the first semiconductor transistor. A gate stack of the second semiconductor transistor and the top of a gate stack of the first semiconductor transistor may overlap by greater than or equal to 90%. The first semiconductor transistor and the second semiconductor transistor may have a similar level of operation characteristics.

24 Claims, 14 Drawing Sheets

(51) Int. Cl.
*H01L 29/786* (2006.01)
*H10B 10/00* (2023.01)

(52) U.S. Cl.
CPC .... *H01L 29/78391* (2014.09); *H01L 29/7869* (2013.01); *H10B 10/125* (2023.02)

(56) References Cited

U.S. PATENT DOCUMENTS

| | | | |
|---|---|---|---|
| 8,134,152 | B2 | 3/2012 | Choi et al. |
| 9,564,217 | B1 | 2/2017 | Zhou et al. |
| 2012/0056268 | A1 | 3/2012 | Mizutani et al. |
| 2015/0053935 | A1 | 2/2015 | Gupta et al. |
| 2015/0287745 | A1* | 10/2015 | Kato ............. H01L 27/0688 257/43 |
| 2015/0294990 | A1 | 10/2015 | Yamazaki et al. |
| 2017/0162710 | A1* | 6/2017 | Shih ............. H01L 29/78693 |

OTHER PUBLICATIONS

Univ. of Berkeley, EE 143, Fall 2016, Lecture 1, Univ. of Berkeley, https://inst.eecs.berkeley.edu/~ee143/fa16/lectures/Lecture13-MOSFET%20Devices.pdf (Year: 2016).*

Misra et al.m "High-k Gate Dielectrics", The Electrochemical Society interface, summer 2005, pp. 30-34 (Year: 2005).*

Bashir R et al, "A Novel Three Dimensional BICMOS Process Using Epitaxial Lateral Overgrowth of Silicon", Proceedings of the Custom Integrated Circuits Conference. San Diego, May 12-15, 1991, pp. 18.2.1-18.2.4, XP000295772.

Extended European Search Report dated Mar. 24, 2022 issued in corresponding European Patent Application No. 21203986.1-1212.

Pasandi, et al. "A New VDD- and GND-Floating Rails SRAM with Improved Read SNM and without Multi-Level Voltage Regulator", IEEE, pp. 377-381, 2014.

* cited by examiner

COMPLEMENTARY METAL OXIDE SEMICONDUCTOR DEVICE

CROSS-REFERENCE TO RELATED APPLICATIONS

This application is based on and claims priority under 35 U.S.C. § 119 to Korean Patent Application Nos. 10-2020-0163331, filed on Nov. 27, 2020 and 10-2021-0036078 filed on Mar. 19, 2021 in the Korean Intellectual Property Office, the disclosures of each of which are incorporated by reference herein in their entirety.

BACKGROUND

Some example embodiments relate to semiconductor devices having a structure in which a semiconductor transistor and a metal-oxide semiconductor transistor are stacked, and/or semiconductor apparatuses including the semiconductor devices.

A complementary metal-oxide semiconductor (CMOS) device is used for processing digital signals and/or storing data. For example, a CMOS transistor is used to implement a memory and/or a logic circuit, such as at least one of a bipolar CMOS (BiCMOS) circuit, a CMOS type static random access memory (SRAM) cell circuit, etc., which are implemented with a high frequency bipolar transistor.

Due to the current tendency for light weight, short, and small electronic devices, improvement in the degree of integration of a CMOS device is being pursued.

SUMMARY

Provided are complementary metal-oxide semiconductor (CMOS) devices having excellent performance and/or a high degree of integration, and semiconductor apparatuses including the same.

Additional aspects will be set forth in part in the description which follows and, in part, will be apparent from the description, and/or may be learned by practice of example embodiments.

According to some example embodiments, a semiconductor device includes a first semiconductor transistor including a semiconductor substrate including a first source, a first drain, a first channel layer between the first source and the first drain, and a first gate stack covering the first channel layer and including a first dielectric layer and a first gate electrode, and a second semiconductor transistor including a second source, a second drain, a second channel layer between the second source and the second drain and including a semiconductor material having metal-oxide, and a second gate stack covering the second channel layer and including a second dielectric layer and a second gate electrode.

The second semiconductor transistor is on the first semiconductor transistor so that the second gate stack overlaps a top of the first gate stack by an amount greater than or equal to 90% of the top of the first gate stack in cross-section, and a ratio of a β value of the first semiconductor transistor to a β value of the second semiconductor transistor is greater than or equal to 0.9 and less than or equal to 2.0.

β is given by the following equation:

$$\beta = \mu C_{ox}\left(\frac{W}{L}\right),$$

wherein μ represents a mobility of channel layers of each semiconductor transistor, Cox represents a capacitance of dielectric layers of each semiconductor transistor, and W and L respectively represent a width and a length of channel layers of each semiconductor transistor The first source and the first drain of the first semiconductor transistor may have a p-type polarity (e.g. may include p-type impurities), and the second source and the second drain of the second semiconductor transistor may have an n-type polarity (e.g. may include n-type impurities).

The second dielectric layer may have an equivalent oxide thickness (EOT) less than that of the first dielectric layer. For example, an EOT of the second dielectric layer may be less than or equal to 0.95 times and greater than or equal to 0.1 times an EOT of the first dielectric layer, and the EOT of the first dielectric layer may be greater than or equal to 0.5 nm and less than or equal to 2.0 nm, and the EOT of the second dielectric layer may be greater than or equal to 0.2 nm and less than or equal to 1.0 nm. The second dielectric layer may include high-k materials, and the first dielectric layer may include paraelectric materials and high-k materials. The first dielectric layer may include a first layer including paraelectric materials and a second layer including high-k materials.

The second channel layer may include an oxide of one or more metals selected from the group consisting of or including indium (In), zinc (Zn), gallium (Ga), tin (Sn), vanadium (V), titanium (Ti), copper (Cu), and tungsten (W). For example, the second channel layer may include two or more metal elements, wherein one of the metal elements is indium (In), and a ratio of the indium content to the total content of the rest of the metal elements may be greater than or equal to 0.5.

The second gate electrode of the second semiconductor transistor may face opposite to the first gate electrode, and may be arranged on a rear side of the second dielectric layer and the second channel layer.

The semiconductor device may include a first contact electrically connected to the first drain and the second drain, a second contact electrically connected to the first source, and a third contact electrically connected to the second source, wherein the second contact and the third contact overlap (e.g. overlap in cross-section) by greater than or equal to 90%, or less than or equal to 10%.

The second semiconductor transistor may include a third gate stack which includes a third dielectric layer and a third gate electrode, and may be arranged opposite to the second gate stack with respect to the second channel layer.

According to some example embodiments, a semiconductor device may include a first semiconductor transistor including a first source, a first drain, a first channel layer between the first source and the first drain, and a first gate stack covering the first channel layer and including a first dielectric layer and a first gate electrode, and a second semiconductor transistor including a second source, a second drain, a second channel layer between the second source and the second drain and including a semiconductor material including a metal oxide, and a second gate stack covering the second channel layer and including a second dielectric layer and a second gate electrode. The second semiconductor transistor is on the first semiconductor transistor so that a top of the first gate stack underlaps the second gate stack by an amount greater than or equal to 90% of the second gate stack in cross-section, and a ratio of an absolute value of a first drive current of the first semiconductor transistor to an absolute value of a second drive current of the second semiconductor transistor, is greater than or equal to 0.9 and less than or equal to 2.0.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF SOME EXAMPLE EMBODIMENTS

Figure 1A:
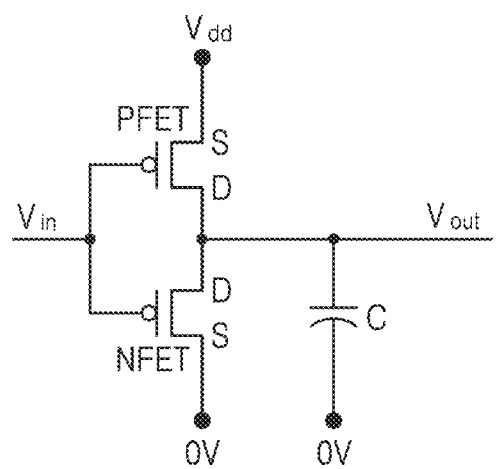
FIGS. 1A and 1B are respectively a circuit diagram and a cross-sectional diagram/top view of a layout of a conventional complementary metal-oxide semiconductor (CMOS) inverter.

Reference will now be made in detail to some example embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The terms used in the present specification are merely used to describe exemplary embodiments, and are not intended to limit technical ideas. It will be understood that when a component is referred to as being "on" or "on the top of" another component, the component can be directly on, under, on the left of, or on the right of the other component, or can be on, under, on the left of, or on the right of the other component in a non-contact manner.

An expression used in the singular encompasses the expression of the plural, unless it has a clearly different meaning in the context. In the present specification, it is to be understood that the terms such as "including," "having," and "comprising" are intended to indicate the existence of the features, numbers, operations, actions, components, parts, ingredients, materials, or combinations thereof disclosed in the specification, and are not intended to preclude the possibility that one or more other features, numbers, steps, actions, components, parts, ingredients, materials, or combinations thereof may exist or may be added.

While such terms as "first," "second," "third," etc. may be used to describe various components, orders, types, etc. of such components must not be limited to the above terms. The above terms are used only to distinguish one component from another. In addition, the terms "unit," "means," "module," "part," etc. described herein mean a unit for performing certain function or operation, and can be implemented as a hardware or a software, or as a combination of a hardware and a software.

Hereinafter, some example embodiments will be described in detail with reference to the accompanying drawings. In the drawings, like reference numerals demote like elements, and sizes (or width, thickness of layers, areas, etc.) of each component are exaggerated for clarity and convenience in explanation. Meanwhile, embodiments described below are provided only as an example, and thus can be embodied in various forms.

In general, a complementary metal-oxide semiconductor (CMOS) device includes both of an N metal-oxide-semiconductor field-effect transistor (NMOSFET) and a P metal-oxide-semiconductor field-effect transistor (PMOSFET). A CMOS inverter may be an example of a CMOS device. The CMOS inverter is or includes a circuit which operates to invert inputs and outputs. For example, when 0 (a logic 0) is input to the CMOS inverter, the CMOS inverter outputs 1 (a logic 1), and when 1 is input to the CMOS inverter, the CMOS inverter outputs 0.

FIG. 1A is a circuit diagram of a CMOS inverter. The CMOS inverter may have a structure in which gates of the NMOSFET and the PMOSFET are connected to receive an input voltage Vin, and drains of the NMOSFET and the PMOSFET are connected to release an output voltage Vout. A source of the NMOSFET may be grounded (0V) GND, and a source of the PMOSFET may be connected to a power supply Vdd. When looking into the operation principle of the CMOS inverter, when the input voltage Vin is 0V, a current may flow only in the channel of the PMOSFET, with minimal or no current flowing in the NMOSFET, and accordingly, the Vdd voltage applied to the source of PMOS may be output (e.g., on-state). On the contrary, when the input voltage Vin is Vdd, a current may flow only in the channel of the NMOSFET, not the PMOSFET, and thus, 0V, which has been applied to the source of NMOS, may be output (e.g., off-state). For example, the CMOS inverter may be designed to have a low power circuit by operating only one of the NMOSFET and the PMOSFET according to the input voltage Vin. A load of the CMOS inverter may be modeled and/or represented by another component, such as but not limited to a capacitor C.

Figure 1B:
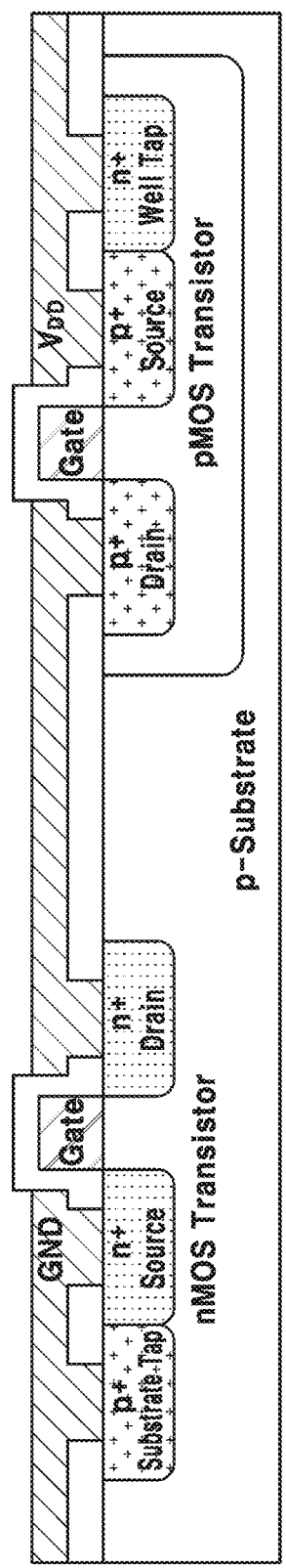
Figure 1B:
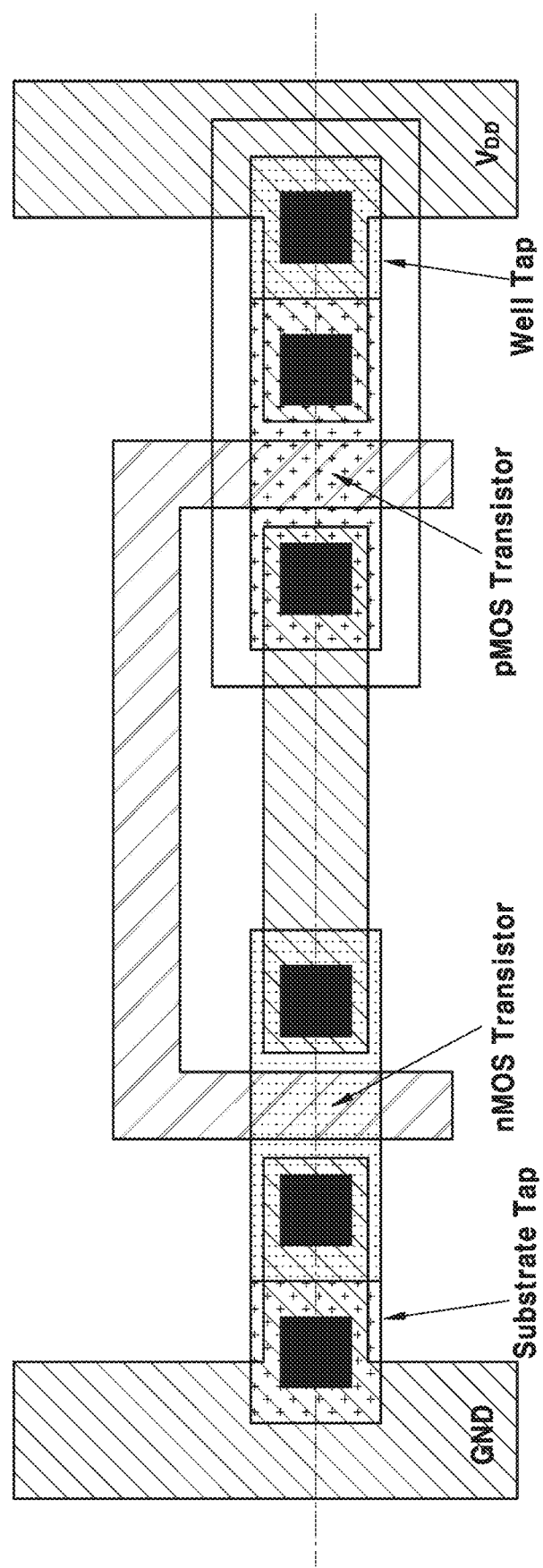

FIG. 1B is a layout diagram of a conventional CMOS inverter. As the NMOSFET and the PMOSFET are arranged horizontally on the substrate, it implementing a high density integration may be difficult due to an increased layout area of the devices.

There may be a large number of square features in the layout of the conventional CMOS inverter, and/or a horizontal area of the CMOS inverter may be large. It may be difficult to downscale/shrink the layout of a conventional CMOS inverter.

Thus, a method of reducing a layout area of devices by stacking the NMOSFET and the PMOSFET on the substrate may be suggested. However, when both of the NMOSFET and the PMOSFET include a semiconductor material such as silicon (Si) or single-crystal silicon, due to high temperature processing required or used when forming a silicon channel layer of the top MOSFET or forming a source/drain region (when doping and/or activating impurities), performance and/or reliability of the bottom MOSFET may be deteriorated.

The semiconductor device according to some example embodiments includes a first semiconductor transistor including a semiconductor channel layer, and a second semiconductor transistor including a metal oxide semiconductor channel layer, and may have a structure in which the second semiconductor transistor is stacked on top of the first semiconductor transistor. Through low temperature evaporation of the metal oxide semiconductor or the semiconductor material including a metal oxide, the second semiconductor transistor may be formed without or with reduced deterioration of the lower first semiconductor transistor.

Figure 2A:
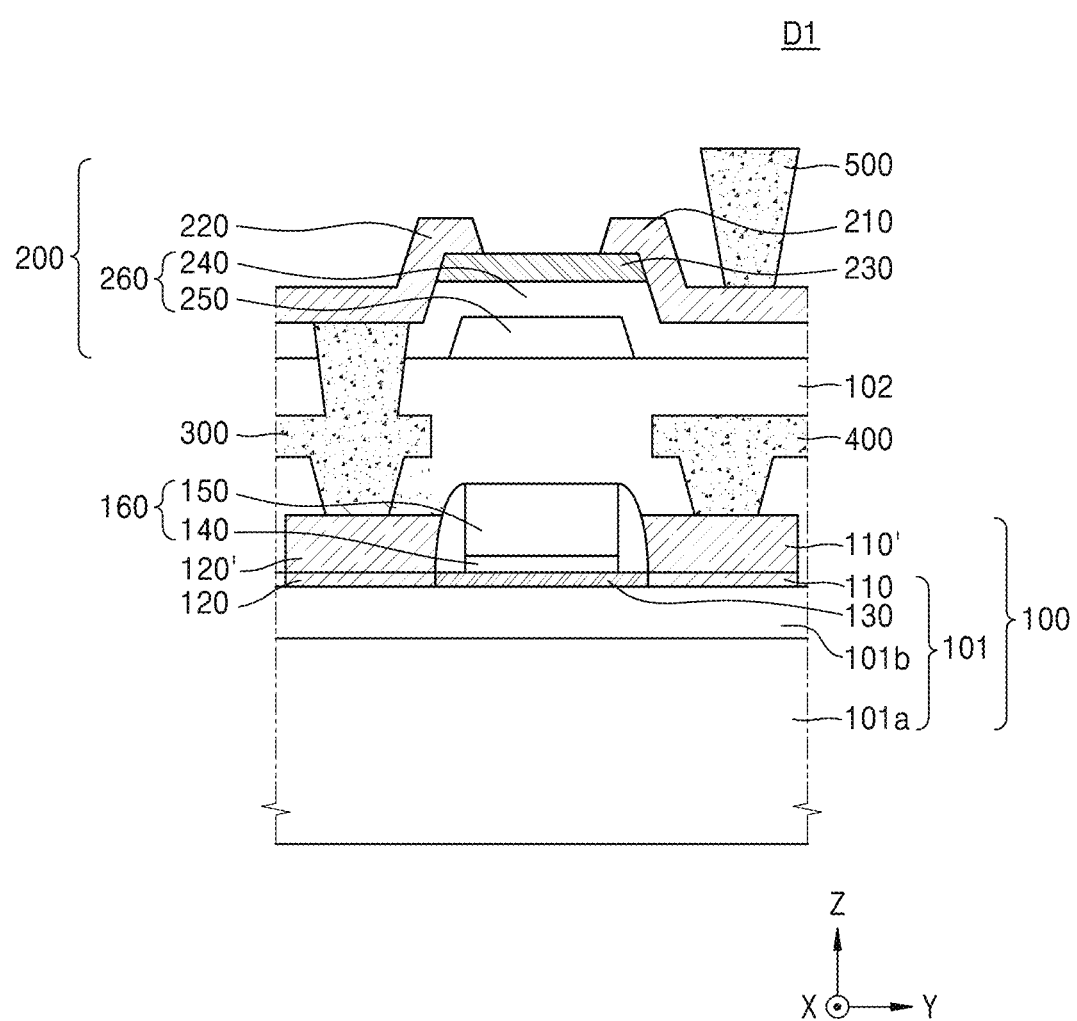
FIGS. 2A and 2B are respectively a cross-sectional diagram and a plan view showing a layout of voltage terminals, of a semiconductor device according to some example embodiments.
Figure 2B:
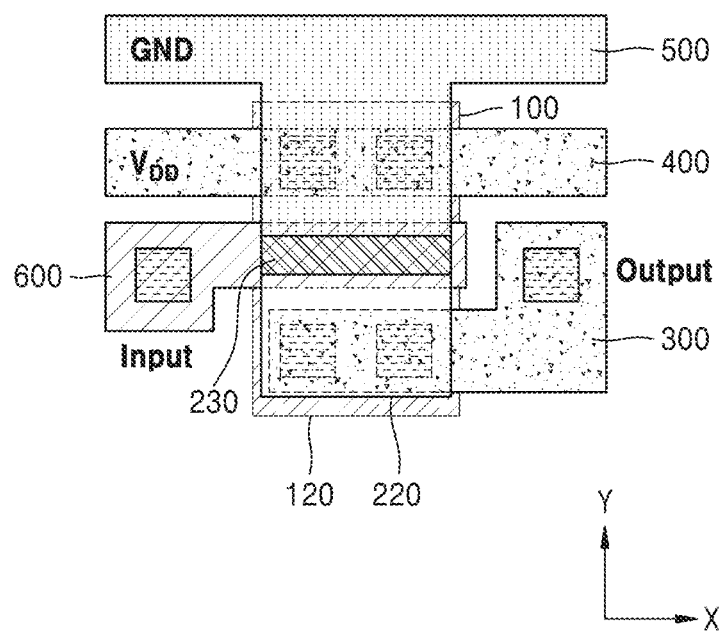

FIGS. 2A and 2B are a cross-sectional diagram and a plan view showing a layout of voltage terminals, of a semiconductor device according to some example embodiments, respectively. Specifically, a semiconductor element D1 may include a first semiconductor transistor 100 and a second semiconductor transistor 200 located on top of the first semiconductor transistor 100. The first semiconductor transistor 100 may be or may include a PMOSFET, and the second semiconductor transistor 200 may be or may include an NMOSFET. The first semiconductor transistor 100 may include a first source 110, a first drain 120, portions of a semiconductor substrate 101 including a first channel layer 130 arranged between the first source 110 and the first drain 120, and a gate stack 160, arranged to cover the first channel layer 130 and including a first dielectric layer 140 and a first gate electrode 150. A second semiconductor transistor 200 may include a second source 210, a second drain 220, and a second channel layer 230 arranged between the second source 210 and the second drain 220 and including a metal-oxide semiconductor (e.g. a semiconductor material including a metal oxide), and a second gate stack 260 arranged to cover the second channel layer 230 and including a second dielectric layer 240 and a second gate electrode 250. The second semiconductor transistor 200 may be arranged on the first semiconductor transistor 100 so that the second gate stack 260 overlaps the top of the first gate stack 160 such that an area of overlap, such as a ratio of a cross-sectional area of overlap of the first gate stack and the second gate stack to a cross-sectional area of the first gate stack is greater than or equal 90%, greater than or equal to 92%, or greater than or equal to 95%. In this manner, the semiconductor device D1 may implement a high degree of integration.

Meanwhile, an NMOSFET and a PMOSFET are required to/intended to/designed to have a similar level of operation characteristics to drive a semiconductor device (CMOS inverter) normally. For example, when a difference in drive current values between the NMOSFET and the PMOSFET is large, e.g. is significant, the on/off switching characteristics are low, and such semiconductor device may be difficult to be actually used for a memory or a logic circuit, etc.

The semiconductor device D1 according to some example embodiments may have the first semiconductor transistor 100 and the second semiconductor transistor 200, which have similar operation characteristics. For example, the first semiconductor transistor 100 and the second semiconductor transistor 200 may have a similar β value represented by equation below. For example, the ratio of the β value of the first semiconductor transistor 100 to the β value ratio of the second semiconductor transistor 200 may be close to 1.0. For example, the β value of the first semiconductor transistor 100 may be greater than equal to 0.9, greater than or equal to 0.95, greater than or equal to 1.0, greater than or equal to 1.2, less than or equal to 2.0, or less than or equal to 1.8, compared to the β value of the second semiconductor transistor 200.

$$\beta = \mu C_{ox}\left(\frac{W}{L}\right)$$

In the above equation, μ represents a mobility of channel layers 130 and 230 of each semiconductor transistor (e.g. a mobility of the majority carriers), Cox represents a capacitance of dielectric layers 140 and 240 of each semiconductor transistor, and W and L respectively represent a width and a length of the channel layers 130 and 230 of each semiconductor transistor (e.g. a channel length and a channel width of the channel layers 130 and 230). In FIGS. 2A and 2B, L represents a length of each channel layer 130 and 230 extending in the Y direction, and W represents a width of each channel layer 130 and 230 extending in the X direction. The width W may be greater than the length L of each of the channel layers 130 and 230; however, example embodiments are not limited thereto.

Further, the first semiconductor transistor 100 and the second semiconductor transistor 200 may be controlled for the dielectric layers 140 and 240 to have each different capacitance Cox. Specifically, the first dielectric layer 140 and the second dielectric layer 240 may have different one of at least one of a dielectric constant, composition, or thickness.

For example, the second dielectric layer 240 may have a dielectric constant greater than that of the first dielectric layer 140. Or, the second dielectric layer 240 may have an equivalent oxide thickness (EOT) less than that of the first dielectric layer 140. An EOT of the second dielectric layer 240 may be less than or equal to 0.95 times, less than or equal to 0.90 times, less than or equal to 0.80 times, less than or equal to 0.75 times, greater than or equal to 0.1 times, or greater than or equal to 0.2 times an EOT of the first dielectric layer 140. The first dielectric layer 140 may be the EOT of greater than or equal to 0.5 nm (5 Å), greater than or equal to 0.7 nm (7 Å), greater than or equal to 1.5 nm or more (15 Å), less than or equal to 2.0 nm (2 Å), less than or equal to 1.8 nm (18 Å), or less than or equal to 1.5 nm (15 Å), and the second dielectric layer 240 may have the EOT greater than or equal to 0.2 nm (2 Å), greater than or equal to 0.3 nm (3 Å), less than or equal to 1.0 nm (10 Å), or less than or equal to 0.8 nm (8 Å).

The first dielectric layer 140 and the second dielectric layer 240 may include the same or different materials. For example, the first dielectric layer 140 and the second dielectric layer 240 may each independently include at least one of a silicon oxide, a silicon nitride, an aluminum oxide, a hafnium oxide, a zirconium oxide, etc., and/or include a two-dimensional (2D) insulator such as a hexagonal boron nitride (h-BN). Further, the composition of the first dielectric layer 140 and the second dielectric layer 240 may be adjusted such that the first dielectric layer 140 and the second dielectric layer 240 have each different dielectric constant. For example, the second dielectric layer 240 may include high-k materials and may not include a paraelectric material, whereas the first dielectric layer 140 may include both paraelectric materials and high-k materials. Specifically, the first dielectric layer 140 may have a multi-layer structure having a first layer including paraelectric materials and a second layer including high-k materials, the second dielectric layer 240 may have a single-layer structure including high-k materials. The paraelectric materials may include silicon oxide ($SiO_2$), silicon nitride ($SiN_x$), or a combination thereof. The high-k materials may include hafnium oxide ($HfO_2$), hafnium silicon oxide ($HfSiO_4$), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), strontium titanium oxide ($SrTiO_3$), yttrium oxide ($Y_2O_3$), aluminum oxide ($Al_2O_3$), red scandium tantalum oxide ($PbSc_{0.5}Ta_{0.5}O_3$), red zinc niobate ($PbZnNbO_3$), or combinations thereof, and/or may include AlON, ZrON, HfON, LaON, YON, ZrSiON, HfSiON, YSiON, LaSiON, ZrAlON, HfAlON, or combinations thereof.

The thickness of the first dielectric layer 140 and the second dielectric layer 240 may each independently be greater than or equal to 0.1 nm (1 Å), greater than or equal to 0.3 nm (3 Å), or greater than or equal to 0.5 nm (5 Å), greater than or equal to 1 nm (10 Å), greater than or equal to 1.5 nm (15 Å), greater than or equal to 2.0 nm (20 Å), greater than or equal to 2.5 nm (25 Å), less than or equal to 20 nm (200 Å), less than or equal to 18 nm (180 Å), less than or equal to 15 nm (150 Å), less than or equal to 10 nm (100 Å), less than or equal to 8 nm (80 Å), less than or equal to 5 nm (50 Å), less than or equal to 4 nm, less than or equal to 3 nm (30 Å), less than or equal to 2 nm (20 Å), or less than or equal to 1 nm (10 Å). The first dielectric layer 140 and the second dielectric layer 240 may have different thicknesses. For example, the second dielectric layer 240 may have a thickness less than that of the first dielectric layer 140. Specifically, a thickness of the second dielectric layer 240 may be less than or equal to 0.95 times, less than or equal to 0.90 times, less than or equal to 0.80 times, less than or equal to 0.75 times, greater than or equal to 0.1 times, or greater than or equal to 0.2 times a thickness of the first dielectric layer 140.

The second channel layer 230 may include a metal oxide semiconductor material, e.g. may have a structure of MxOy, where M is a metal and O is oxygen. For example, the second channel layer 230 may include an indium oxide ($In_2O_3$), a zinc oxide (ZnO), a tin oxide ($SnO_2$), and/or a gallium oxide ($Ga_2O_3$). The second channel layer 230 may have a crystalline structure, a poly-crystalline structure, or an amorphous structure; however, example embodiments are not limited thereto. Metal oxides included in the second channel layer 230 may further include dopants. For example, the second channel layer 230 may include two or more metal elements, and one of them may be indium (In). The indium content may be greater than or equal to 0.5, greater than or equal to 0.55, greater than or equal to 0.6, less than or equal to 0.95, greater than or equal to 0.9, greater than or equal to 0.85, or greater than or equal to 0.8., compared to the content of the rest of the metal elements. Specifically, the second channel layer 230 may include indium gallium zinc oxide (IGZO).

The second channel layer 230 may have a mobility (e.g. one of an electron mobility or a hole mobility) less than that of the first channel layer 130 (e.g. one of an electron mobility or a hole mobility). For example, the mobility of the second channel layer 230 may be less than or equal to 0.9 times, less than or equal to 0.8 times, less than or equal to 0.7 times, less than or equal to 0.6 times, less than or equal to 0.5 times, greater than or equal to 0.1 times, or greater than or equal to 0.2 times the mobility of the first channel layer 130.

The majority carriers of the first channel layer 130 may be the same, or may be different, than the majority carriers of the second channel layer 230. For example, the majority carriers of the first channel layer 130 may be one of electrons or holes, and the majority carriers of the second channel layer 230 may be the other of electrons or holes.

The first channel layer 130 may include various materials having semiconductor property. For example, the first channel layer 130 may have a single-crystal structure and may include one, or two or more selected from the group consisting of Group IV semiconductors, Groups III-V semiconductors, a nitride semiconductor, an oxynitride semiconductor, a two-dimensional (2D) material, quantum dots, organic semiconductors, and combinations thereof. The Group IV semiconductors may include Si, Ge, SiGe, etc., and the 2D material may include a transition metal dichalcogenide (TMD) or a graphene, and the quantum dots may include colloidal quantum dots, nanocrystal structures, etc.

The first source 110 and the first drain 120 may have a p-type polarity and may include dopants such as boron, and the second source 210 and the second drain 220 may have an n-type polarity and may include dopants such as at least one of phosphorus or arsenic.

Either of or both of first source 110 and the first drain 120 may include other counter-dopants such as at least one of phosphorus or arsenic arranged in a halo or pocket region (not illustrated). Either of or both of the second source 210 and the second drain 220 may not include any counter-dopants. However, example embodiments are not limited thereto.

The first and second sources 110 and 210 and the first and second drains 120 and 220 may be formed of conductive materials. For example, the first and second sources 110 and 210 and the first and second drains 120 and 220 may each independently include at least one of a metal, a metal compound such as a silicide, or a conductive polymer.

Further, the first source 110 and the first drain 120 may include a material of semiconductor substrate 101 as a base material, and may be formed by injecting/implanting/incorporating impurities into each different area of the semiconductor substrate 101. For example, the first source 110 and the first drain 120 may be formed in an integrated manner with the semiconductor substrate 101, and the first channel layer 130 may also be defined as an area of the semiconductor substrate 101 between the first source 110 and the first drain 120. The first source 110 and the first drain 120 may include a p-type doping materials (impurities). The p-type doping materials (impurities) may be III group elements, such as at least one of boron (B), aluminum (Al), indium (In), and/or gallium (Ga). The concentration of doping materials of the source 120 and the drain 130 may each independently exceed $1 \times 10^{19}/cm^3$.

Alternatively or additionally, the first source 110 and the first drain 120 may include a raised form. For example, the first source 110 and the first drain 120 may include raised source 110' and drain 120'. For example, the raised source 110' and the raised drain 120' may include an epitaxial layer, such as a layer epitaxially grown on the substrate 101.

The semiconductor substrate 101 may include semiconductor materials such as silicon (Si), germanium (Ge), silicon germanium (SiGe), silicon carbide (SiC), gallium arsenide (GaAs), indium arsenide (InAs), indium phosphide (InP), etc. Alternatively or additionally, the semiconductor substrate 101 may further include insulating materials such as at least one of a silicon oxide, a silicon nitride, a silicon oxynitride, etc. For example, the semiconductor substrate 101 may have a multi-layer structure including a semiconductor material layer 101a and an insulating material layer 101b. For example, the semiconductor substrate 101 may be in the form of silicon on Insulator (SOI); however, example embodiments are not limited thereto.

The first gate electrode 150 and the second gate electrode 250 may each independently have conductivity or sheet resistance less than or equal to 1 Mohm/square, and may have the same or different conductivity. The first and second gate electrodes 150 and 250 may each independently include one, or two or more selected from the group consisting of or including a metal, a metal nitride, a metal carbide, a polysilicon, and combinations thereof. For example, the metal may include at least one of aluminum (Al), tungsten (W), molybdenum (Mo), titanium (Ti), or tantalum (Ta), and a metal nitride film may include at least one of a titanium nitride film (TiN film) or a tantalum nitride film (TaN film), and the metal carbide may be or may include a metal carbide doped with (or containing) aluminum or silicon, and may include, for example, TiAlC, TaAlC, TiSiC or TaSiC. The first and second gate electrodes 150 and 250 may each independently have a structure in which a plurality of materials are stacked. For example, at least one of the first and second gate electrodes 150 and 250 may have a stacked structure of metal nitride layer/metal layer or a stacked structure of metal nitride layer/metal carbide layer/metal layer, such as TiN/TiAlC/W. The first and second gate electrodes 150 and 250 may include a titanium nitride film (TiN film) or molybdenum (Mo), and the above examples may be used in a variety of modified forms.

The second gate electrode 250 may cover the second channel layer 230 and may be arranged on top of the first gate electrode 150 to overlap, e.g. overlap in cross-section, the first gate electrode 150 by a ratio of the cross-section of the overlap to the top of the first gate electrode that is greater than or equal to 90%, greater than or equal to 92%, or greater than or equal to 95%. The second gate electrode 250 may face opposite to the first gate electrode 150 as shown in FIG. 2 and may be arranged at the bottom of the second dielectric layer 240 and the second channel layer 230.

An interlayer insulation layer 102 may be arranged between the first semiconductor transistor 100 and the second semiconductor transistor 200 to perform the function of electrically separating them. The interlayer insulation layer 102 may include an oxide such as a silicon oxide and/or a nitride such as a silicon nitride.

The semiconductor device D1 may include a first contact 300 electrically connected to the first drain 120 (e.g. a top of the first drain 120) and to the second drain 220 (e.g. a bottom of the second drain 120), a second contact 400 electrically connected to the first source 110, and a third contact 500 electrically connected to the second source 210 (e.g. a top of the second source 210). The semiconductor device D1 may include a fourth contact 600 which electrically connects the first gate stack 160 and the second gate stack 260.

A ground voltage GND may be applied to the second source 210 through the third contact 500, and a positive voltage such as a voltage of $V_{DD}$ may be applied to the first source 110 through the second contact 400. The fourth contact 600 may apply the same level of input voltage $V_{in}$ INPUT to the first gate electrode 150 and the second gate electrode 250. The first contact 300 may be connected to an output OUTPUT.

The first contact 300, the second contact 400, the third contact 500, and the fourth contact 600 may include the same or different materials and may each independently be made of a metal, a conductive metal nitride, a metal silicide, or combinations thereof, and may include, for example, conductive materials such as at least one of tungsten, molybdenum, titanium, cobalt, tantalum, nickel, tungsten silicide, titanium silicide, cobalt silicide, tantalum silicide, nickel silicide, etc.

The second contact 400 and the third contact 500 may be arranged to overlap each other to improve a degree of integration of the devices; for example, there may be a vertical line extending perpendicular to an upper surface of the substrate 101 that intersects both the second contact 400 and the third contact 500. In a cross-sectional view or in a plan view perpendicular to the stacking direction (e.g., the z direction), the second contact 400 and the third contact 500 may overlap by ratio of the overlap to the second contact 400 that is, for example, greater than or equal to 90%, greater than or equal to 92%, or greater than or equal to 95%.

Figure 3A:
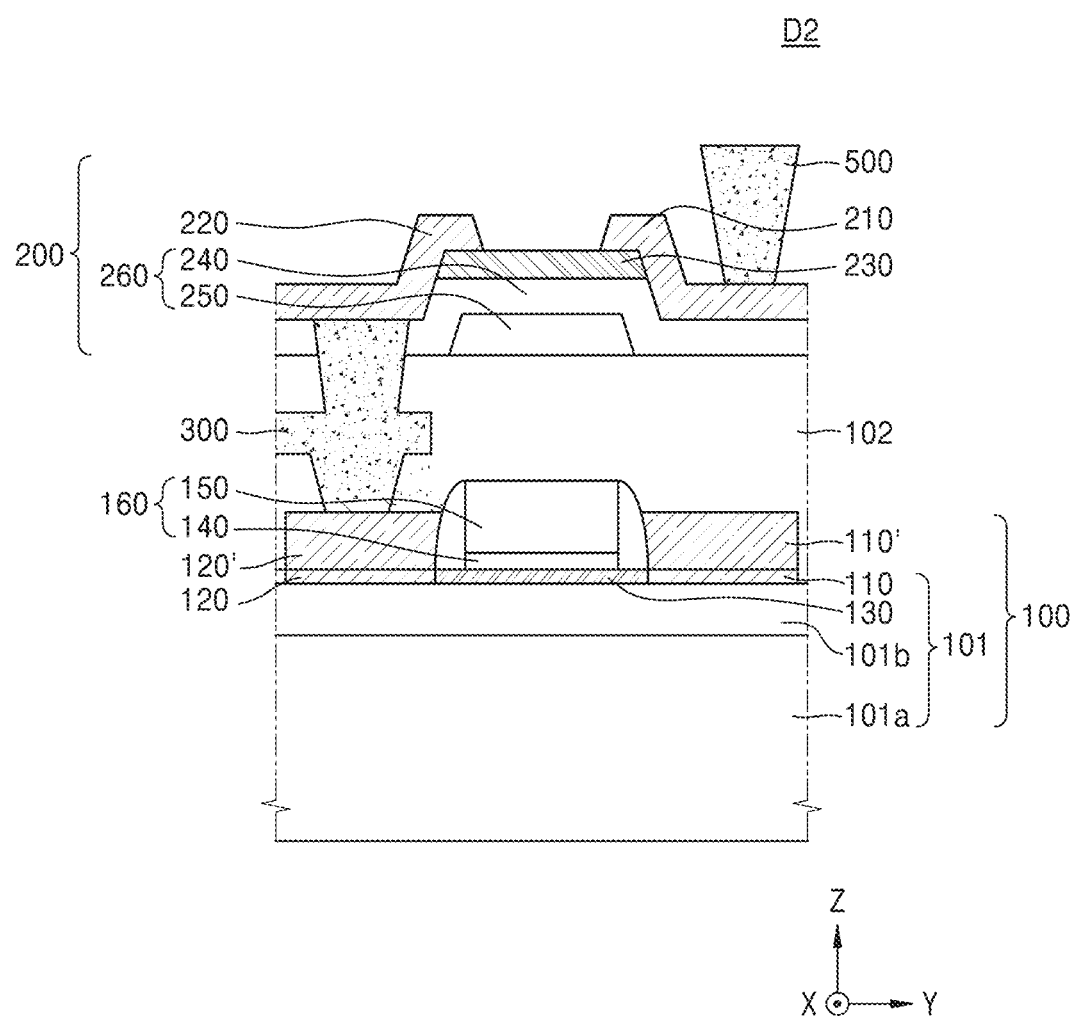
FIGS. 3A and 3B are respectively a cross-sectional diagram and a plan view showing a layout of voltage terminals, of a semiconductor device according to some example embodiments.
Figure 3B:
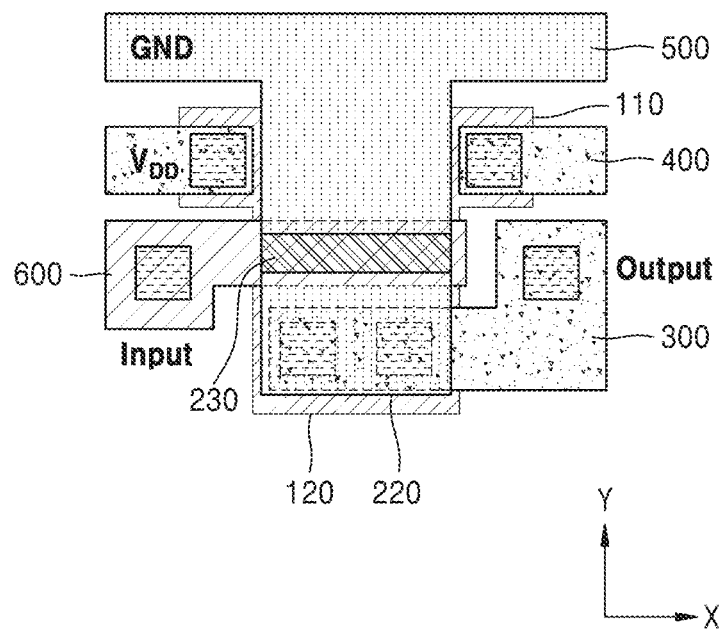

FIGS. 3A and 3B are a cross-sectional diagram and a plan view showing a layout of voltage terminals, of a semiconductor device according to some example embodiments, respectively.

A semiconductor device D2 differs from the semiconductor device D1 of FIGS. 2A and 2B in the arrangement of the second contact 400 and the third contact 500. As illustrated, the second contact 400 and the third contact 500 may not overlap, which may reduce or minimize a leakage current and/or parasitic capacitance. In a plan view perpendicular to the stacking direction (e.g., the z direction), the second contact 400 and the third contact 500 may overlap by, for example, less than or equal to 10%, less than or equal to 8%, or less than or equal to 5%.

Figure 4A:
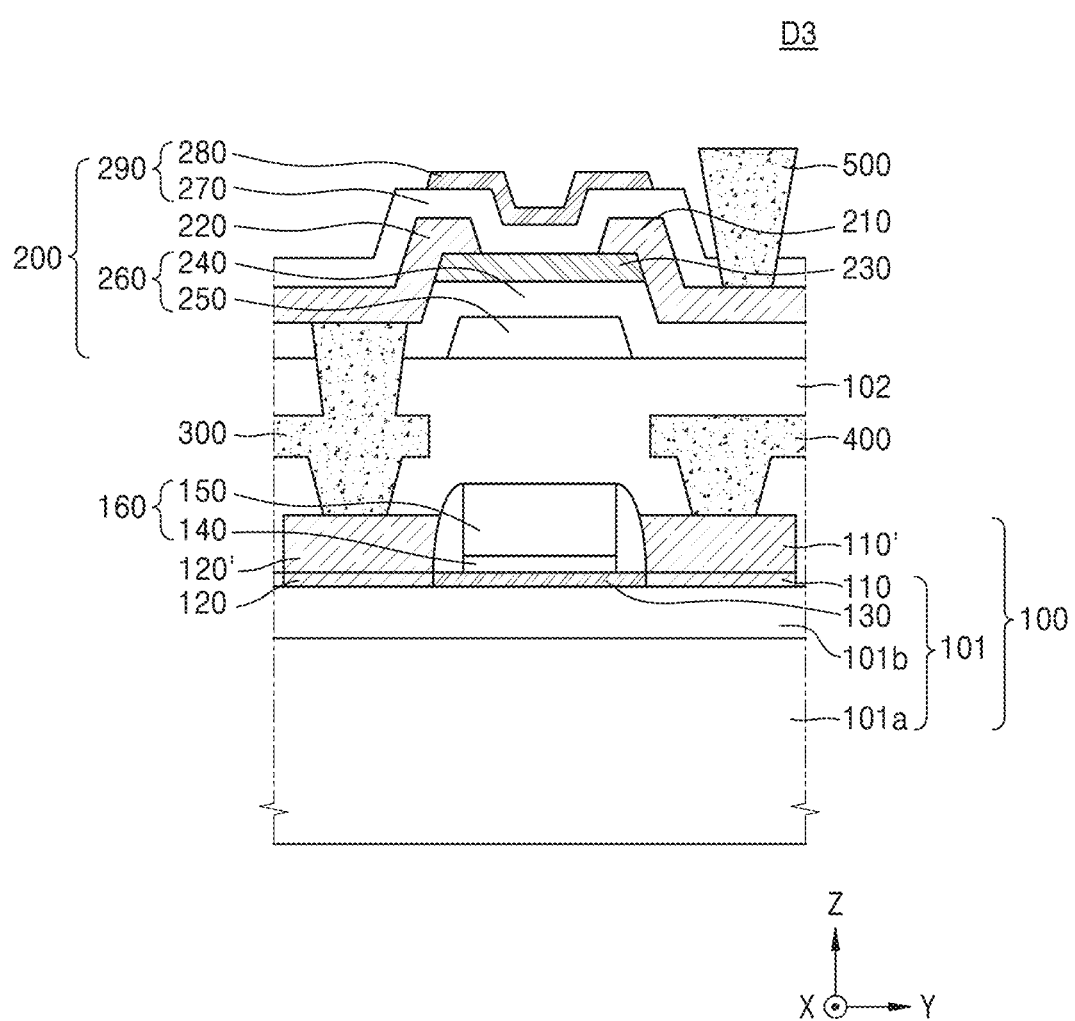
FIGS. 4A and 4B are respectively a cross-sectional diagram and a plan view showing a layout of voltage terminals, of a semiconductor device according to some example embodiments.
Figure 4B:
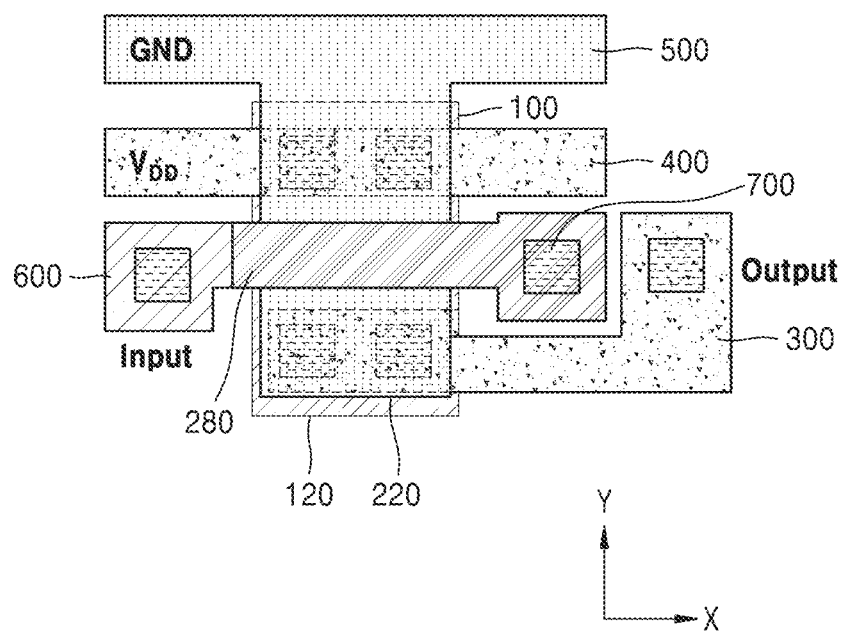

FIGS. 4A and 4B are a cross-sectional diagram and a plan view showing a layout of voltage terminals, of a semiconductor device according to some example embodiments, respectively.

With reference to FIG. 4A, the second semiconductor transistor 200 of a semiconductor device D3 differs from the semiconductor device D1 of FIGS. 2A and 2B as it includes a third gate stack 290 including a third dielectric layer 270 and a third gate electrode 280. The third gate stack 290 may be arranged opposite to the second gate stack 260 with respect to the second channel layer 230. The second semiconductor transistor 200 includes two gate stacks 260 and 290 located at the top and the bottom of the second channel layer 230, respectively, and thus may increase a transconductance of the second semiconductor transistor 200.

With reference to FIG. 4B, a ground voltage GND may be applied to the third contact 500, and a voltage of $V_{DD}$ may be applied to the second contact 400. The first contact 300 may be connected to an output OUTPUT. Alternatively or additionally, the semiconductor device D3 may include the fourth contact 600 which electrically connects the first gate stack 160 and the second gate stack 260. The fourth contact 600 may apply the same level of input voltage $V_{in}$ INPUT to the first gate stack 160 and the second gate stack 260. The semiconductor device D3 may further include a fifth contact 700 electrically connected to the third gate stack 290. The fifth contact 700 may independently apply a voltage to the third gate electrode 280. For example, regardless of a voltage applied to the second gate electrode 250, a voltage may independently be applied to the third gate electrode 280, and in such case, a threshold voltage Vth of the second semiconductor transistor 200 may be more easily adjusted.

Meanwhile, in some example embodiments, the fourth contact 600 may be further electrically connected to the third gate stack 290. In this case, the two gate electrodes of the second semiconductor transistor 200, i.e., the second gate electrode 250 and third gate electrode 280, may be electrically connected, and the transconductance of the second semiconductor transistor 200 may increase. Such example embodiments may be selected, for example, when the β value of the second semiconductor transistor 200 is low.

The semiconductor transistors 100 and 200, which are provided in the semiconductor devices D1, D2 and D3, may be implemented in various forms such as in two-dimension, three-dimension, etc. For example, the semiconductor transistors 100 and 200 may have a 1-gate on channel structure such as a planar-FET, or a 3-gate on channel structure, in which a source, a drain, and a channel are protruded in the form of a fin, and gate electrodes surround the channel, such as a Fin-FET. Or, they may have a 4-gate on channel, such as a gate-all-around-FET.

The semiconductor device may be used as a logic element and/or a memory device or memory cell in various electronic devices. The semiconductor device according to embodiments may be driven with low power, and thus may meet or satisfy the demand or expectations of miniaturization and/or integration of electronic devices. For example, the semiconductor device and the semiconductor apparatus including the same may be used for arithmetic operations, execution of programs, temporary data maintenance, etc. in electronic devices such as a mobile device, a computer, a notebook, a sensor, a network device, a neuromorphic device, etc. The semiconductor device and/or the semiconductor apparatus according to embodiments may be useful for electronic devices continuously performing a large-scale data transmission.

For example, the semiconductor device according to some example embodiments may be applied to a semiconductor device such as static random access memory (SRAM).

Figure 5A:
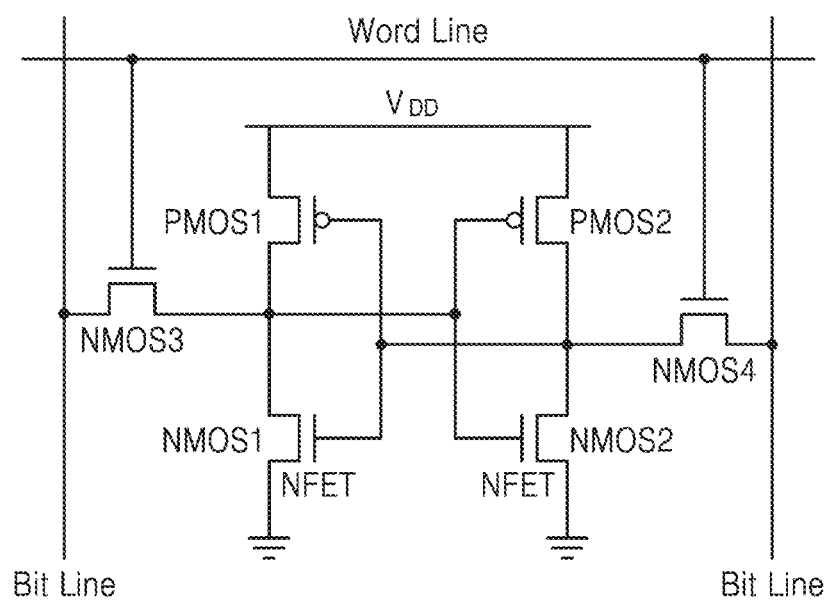
FIG. 5A is a circuit diagram of an SRAM device.
Figure 5B:
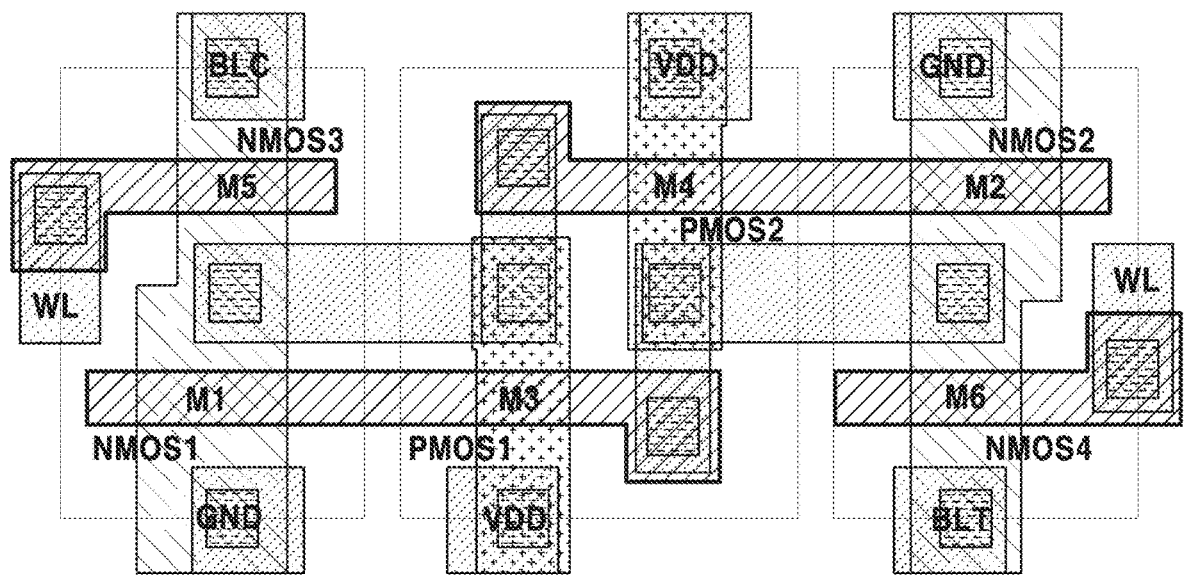
FIG. 5B is a top view of a layout of a conventional semiconductor device (SRAM)

FIG. 5A is a circuit diagram of an SRAM, and FIG. 5B is a layout diagram of a conventional SRAM. With reference to FIGS. 5A and 5B, an SRAM cell may include four NMOSFETs (NMOS1 to NMOS4, or Pass Gate 1, Pass Gate 2, Pull Down 1, and Pull Down 2) and two PMOSFETs (PMOS1 and PMOS2, or Pull Up 1 and Pull Up 2), and these NMOSFETs and PMOSFETs may be arranged on the same plane as illustrated in FIG. 5B. For example, the PMOS1 and the NMOS1 may be serially connected between a power node where the power voltage $V_{DD}$ is supplied and a ground node where a ground voltage $V_{SS}$ is supplied. PMOS1 and NMOS1 may also be referred to as Pull Up 1 and Pull Down 1. Further, the PMOS2 and the NMOS2 may also be serially connected between the power node where the power voltage $V_{DD}$ is supplied and the ground node where the ground voltage $V_{SS}$ is supplied. PMOS2 and NMOS2 may also be referred to as Pull Up 2 and Pull Down 2. The NMOS3 may be connected between the gate electrodes (or gate stacks) of the PMOS2 and the NMOS2, and bit lines, and the NMOS4 may be connected between the gate electrodes (or gate stacks) of the PMOS1 and the NMOS1, and the bit lines. NMOS3 and NMOS4 may also be referred to as Pass Gate 1 and Pass Gate 2. The gate electrode (or gate stack) of the NMOS3 and the NMOS4 may be connected to a row, e.g. to a word line.

The channel width of NMOS1 may be greater than the channel width of NMOS3; similarly, the channel width of NMOS2 may be greater than the channel width of NMOS4. Additionally the channel width of PMOS1 may be less than the channel width of NMOS1. Additionally the channel width of PMOS2 may be less than the channel width of NMOS2. However example embodiments are not limited thereto.

The PMOS1, the PMOS2, the NMOS1, and the NMOS2 may function as cross coupled inverters. The PMOS1, the PMOS2, the NMOS1, and the NMOS2 may function as storage devices for storing data in a semiconductor device. The NMOS3 and the NMOS4 may function as selectors which electrically connect the storage device between the bit lines.

The semiconductor device (SRAM) according to some example embodiments may include a stacked structure in which the NMOS1 and the PMOS1 of FIG. 5B overlap, and a structure in which the NMOS2 and the PMOS2 overlap, and thus may have a higher degree of integration and a fewer number of square features than a conventional semiconductor device (SRAM) shown in FIG. 5B.

Figure 6:
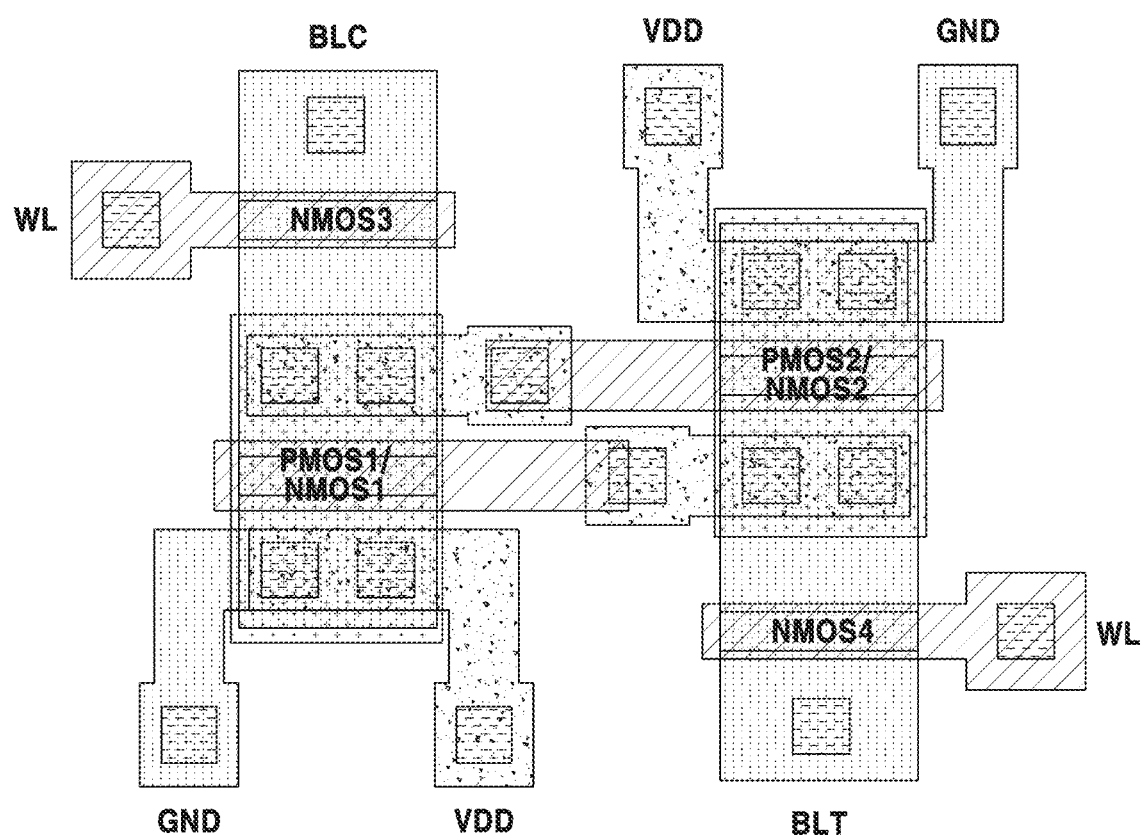
FIG. 6 is a top view of a layout of a semiconductor device (SRAM) according to some example embodiments.

FIG. 6 is a layout diagram of a semiconductor device (SRAM) according to some example embodiments. FIG. 6 is an example implementing the equivalent circuit of FIG. 5A in different form, e.g. in a different layout, than as illustrated in FIG. 5B, and the semiconductor device (SRAM) according to some example embodiments may have a modified structure in which an NMOSFET and a PMOSFET, which are serially connected between the power node and the ground node and arranged horizontally in FIG. 5B, are stacked. For example, as the semiconductor device (SRAM) according to some example embodiments may include two pairs of stacked NMOSFET and PMOSFET (PMOS1/NMOS1 and PMOS2/PMOS2), a degree of integration may increase by 30% compared to the conventional semiconductor device (SRAM) of FIG. 5B. One pair of stacked NMOSFET and PMOSFET may be the semiconductor device described above.

A ratio of channel widths of each of the transistors NMOS1, NMOS2, NMOS3, NMOS4, PMOS1, and PMOS2 may be the same as, or similar to, the transistors illustrated in FIG. 5B. For example, the channel width of NMOS1 may be greater than the channel width of NMOS3; similarly, the channel width of NMOS2 may be greater than the channel width of NMOS4. Additionally the channel width of PMOS1 may be less than the channel width of NMOS1. Additionally the channel width of PMOS2 may be less than the channel width of NMOS2. However example embodiments are not limited thereto. A static noise margin (SNM) may be affected by, or determined by, the channel widths of the above transistors.

Although the SRAM device illustrated above includes six transistors and corresponds to a 6T device, example embodiments are not limited thereto. For example, there may be more than six transistors, or less than six transistors, per SRAM cell according to some example embodiments.

Figure 7:
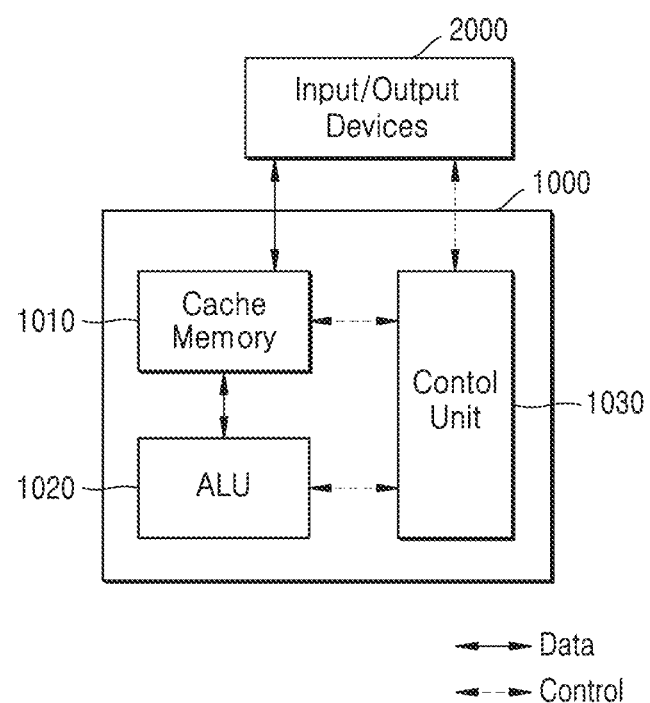
FIGS. 7 and 8 are conceptual diagrams schematically showing an electronic device architecture according to some example embodiments.
Figure 8:
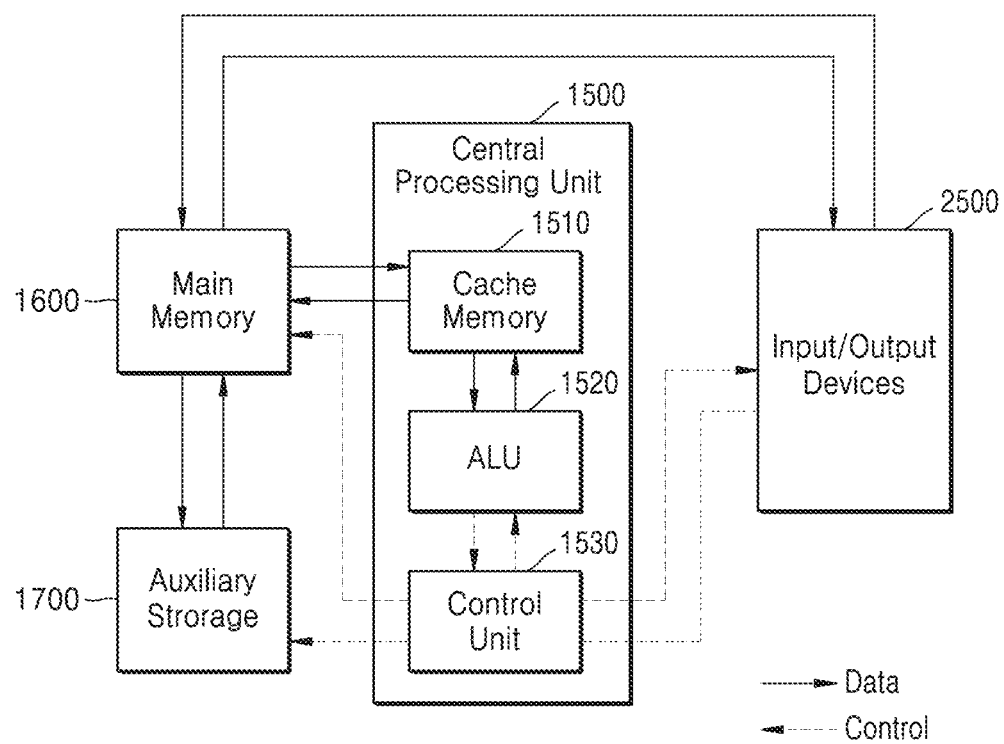

FIGS. 7 and 8 are conceptual diagrams schematically showing an electronic device architecture that may be applied to an electronic apparatus according to some example embodiments. With reference to FIG. 7, an electronic device architecture 1000 may include a memory unit 1010, an arithmetic logic unit (ALU) 1020 and a control unit 1030. The memory unit 1010, the ALU 1020, and the control unit 1030 may be electrically connected. For example, the electronic device architecture 1000 may be implemented as a single chip including the memory unit 1010, the ALU 1020, and the control unit 1030. Specifically, the memory unit 1010, the ALU 1020, and the control unit 1030 may be interconnected by a metal line on an on-chip and communicate directly with each other. The memory unit 1010, the ALU 1020, and the control unit 1030 may be integrated on one substrate in a monolithic manner and constitute a single chip. Input/output devices 2000 may be connected to the electronic device architecture (chip) 1000. At least one of the memory unit 1010, the ALU 1020, and/or the control unit 1030 may each independently include the aforementioned semiconductor devices D1, D2 and D3. Such electronic device architecture (chip) 1000 may be an on-chip memory processing unit. With reference to FIG. 8, a cache memory 1510, an ALU 1520, and a control unit 1530 may constitute/be included in a central processing unit (CPU) 1500. A main memory 1600 and an auxiliary storage 1700 may be provided separately from the CPU 1500, and the main memory 1600 may include dynamic random access memory (DRAM). The cache memory 1510 may include static random access memory (SRAM), and may also include the aforementioned semiconductor devices D1, D2, and D3.

In some cases, the electronic device architecture may be implemented in a form in which computing unit elements and memory unit elements are adjacent to each other on a single chip without separating sub-units.

A semiconductor device having a structure in which a semiconductor transistor and a metal-oxide semiconductor transistor are stacked, and a semiconductor apparatus including the same may be provided. Such semiconductor device may have high operation performance and improved degree of integration, and contribute to miniaturization of electronic devices.

Figure 9:
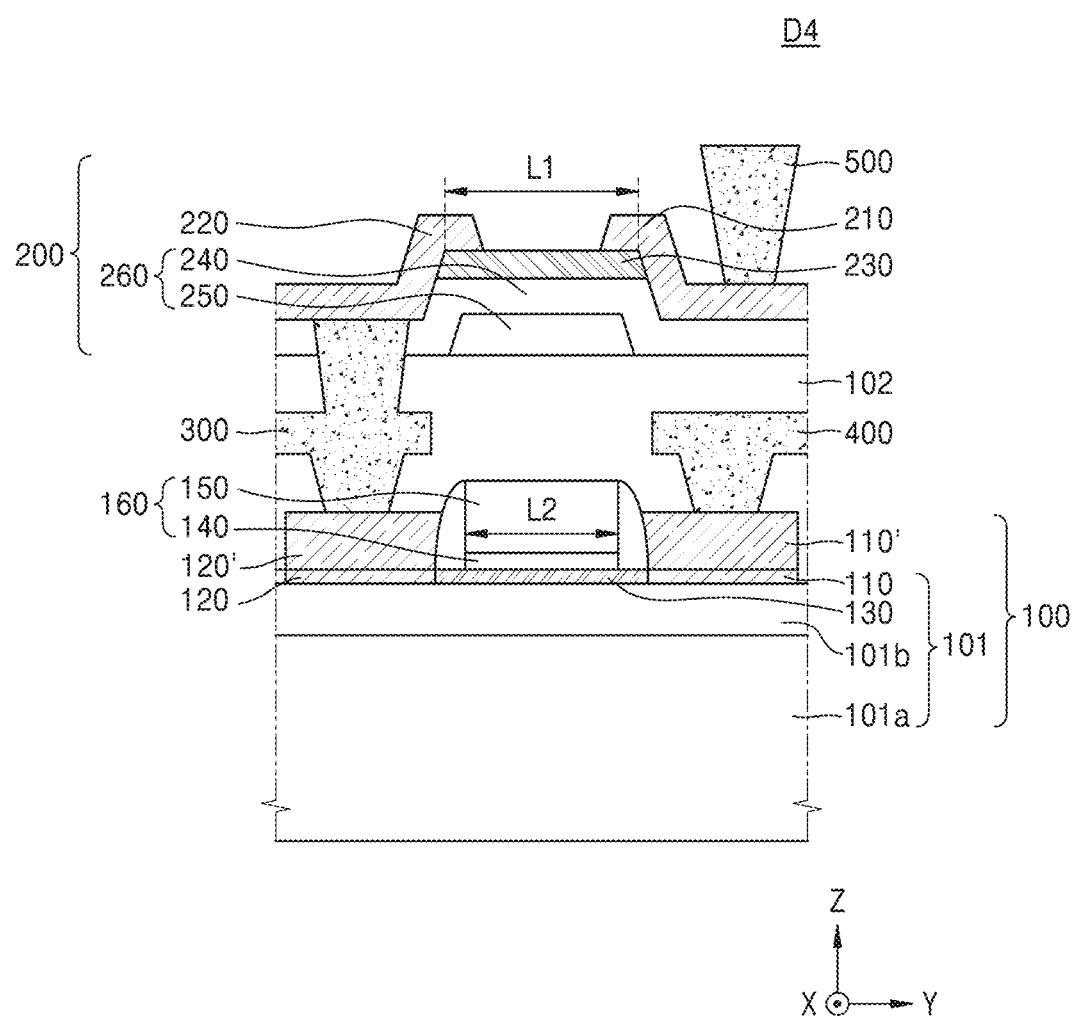
FIG. 9 is a cross-sectional diagram of a semiconductor device according to some example embodiments.

FIG. 9 is a cross-sectional diagram of a semiconductor device according to some example embodiments.

Reviewing FIG. 9, a semiconductor device D4 according to some example embodiments may include a first semiconductor transistor 160 and a second semiconductor transistor 260.

The first semiconductor transistor 160 may have a first channel length L1, and the second semiconductor transistor 260 may have a second channel length L2. The second channel length L2 may be less than or greater than the first channel length L1.

Alternatively or additionally, the first semiconductor transistor 160 may have a first width, and the second semiconductor transistor 260 may have a second width different from the first width.

Alternatively or additionally, the first semiconductor transistor 160 may have a first carrier mobility, e.g. a carrier mobility of electrons at a first level, and the second semiconductor transistor 260 may have a second carrier mobility, e.g. a carrier mobility of holes at a second level different from the first level.

Alternatively or additionally, the first semiconductor transistor 160 may have a first oxide capacitance, and the second semiconductor transistor 260 may have a second oxide capacitance less than the first oxide capacitance.

Transistor drive currents may be based on, or affected by, any or all of the widths of the transistors, the lengths of the transistors, the mobility of majority carriers of the transistors, and the oxide capacitance of the transistors. The drive current of the first semiconductor transistor 160 may be different than the drive current of the second semiconductor transistor 260. The first semiconductor transistor 160 may be the same or different polarity than the second semiconductor transistor 260.

Any of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that some example embodiments described herein should be considered in a descriptive sense only and not for purposes of limitation. Descriptions of features or aspects within each embodiment should typically be considered as available for other similar features or aspects in other example embodiments. None of the as-described example embodiments are necessarily mutually exclusive. While one or more embodiments have been described with reference to the figures, it will be understood by those of ordinary skill in the art that various changes in form and details may be made therein without departing from the spirit and scope as defined by the following claims.

What is claimed is:

1. A semiconductor device comprising:
a first semiconductor transistor including a semiconductor substrate including a first source, a first drain, a first channel layer between the first source and the first drain, and a first gate stack covering the first channel layer and including a first dielectric layer and a first gate electrode; and
a second semiconductor transistor including a second source, a second drain, a second channel layer between the second source and the second drain and including a semiconductor material having metal oxide, and a second gate stack covering the second channel layer and including a second dielectric layer and a second gate electrode,
wherein the second semiconductor transistor is on the first semiconductor transistor so that the second gate stack overlaps a top of the first gate stack by an amount greater than or equal to 90% of the top of the first gate stack in cross-section, and
wherein a ratio of a β value of the first semiconductor transistor to a β value of the second semiconductor transistor is greater than or equal to 0.9 and less than or equal to 2.0, wherein β is given by the following equation, $$\beta = \mu C_{ox}\left(\frac{W}{L}\right)$$

wherein μ represents a mobility of channel layers of each semiconductor transistor, Cox represents a capacitance of dielectric layers of each semiconductor transistor, and W and L respectively represent a width and a length of channel layers of each semiconductor transistor,
wherein the second gate electrode of the second semiconductor transistor faces opposite to the first gate electrode, and is arranged on a rear side of the second dielectric layer and the second channel layer,
wherein a dielectric constant of the second dielectric layer is greater than a dielectric constant of the first dielectric layer,
wherein an equivalent oxide thickness of the second dielectric layer is less than or equal to 0.75 times an equivalent oxide thickness of the first dielectric layer and is greater than or equal to 0.2 times the equivalent oxide thickness of the first dielectric layer, and
wherein a thickness of the second dielectric layer is less than a thickness of first dielectric layer.

2. The semiconductor device of claim 1,
wherein the first source and the first drain each include p-type impurities, and the second source and the second drain each include n-type impurities.

3. The semiconductor device of claim 1,
wherein an equivalent oxide thickness (EOT) of the first dielectric layer is greater than or equal to 0.5 nm and less than or equal to 2.0 nm.

4. The semiconductor device of claim 1,
wherein an equivalent oxide thickness (EOT) of the second dielectric layer is greater than or equal to 0.2 nm and less than or equal to 1.0 nm.

5. The semiconductor device of claim 1,
wherein the second dielectric layer includes high-k materials, and the first dielectric layer includes paraelectric materials and high-k materials.

6. The semiconductor device of claim 5,
wherein the high-k materials include one or more selected from the group including hafnium oxide ($HfO_2$), hafnium silicon oxide ($HfSiO_4$), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), strontium titanium oxide ($SrTiO_3$), yttrium oxide ($Y_2O_3$), aluminum oxide ($Al_2O_3$), red scandium tantalum oxide ($PbSc_{0.5}Ta_{0.5}O_3$), red zinc niobate ($PbZnNbO_3$), AlON, ZrON, HfON, LaON, YON, ZrSiON, HfSiON, YsiON, LaSiON, ZrAlON, or HfAlON.

7. The semiconductor device of claim 5,
wherein the paraelectric materials include one or more selected from the group including $SiO_2$, or $SiN_x$.

8. The semiconductor device of claim 1,
wherein the semiconductor substrate includes at least one selected from the group including Si, Ge, SiGe, and Groups III to V semiconductors.

9. The semiconductor device of claim 3,
wherein the semiconductor substrate includes a silicon on insulator (SOI) structure.

10. The semiconductor device of claim 1,
wherein the second channel layer includes an oxide of one or more metals selected from the group including indium (In), zinc (Zn), gallium (Ga), and tin (Sn).

11. The semiconductor device of claim 10,
wherein the second channel layer includes two or more metal elements, and
one of the metal elements is indium (In), and a ratio of an indium content to a total content of the rest of the metal elements is greater than or equal to 0.5.

12. The semiconductor device of claim 1, further comprising:
an interlayer insulation layer between the first semiconductor transistor and the second semiconductor transistor.

13. The semiconductor device of claim 1, further comprising:
a first contact electrically connected to the first drain and to the second drain;
a second contact electrically connected to the first source; and
a third contact electrically connected to the second source, wherein the third contact overlaps the second contact by greater than or equal to 90% of the second contact in cross-section.

14. The semiconductor device of claim 13, further comprising a fourth contact configured to electrically connect the first gate stack to the second gate stack.

15. The semiconductor device of claim 1, further comprising:
a first contact electrically connected to the first drain and to the second drain;
a second contact electrically connected to the first source; and
a third contact electrically connected to the second source, wherein the third contact overlaps the second contact by less than or equal to 10% of the second contact in cross section.

16. The semiconductor device of claim 1,
wherein the second semiconductor transistor further includes a third gate stack including a third dielectric layer and a third gate electrode, and the third gate stack is opposite to the second gate stack with respect to the second channel layer.

17. The semiconductor device of claim 16, further comprising:
a fifth contact electrically connected to the third gate stack.

18. The semiconductor device of claim 17,
wherein the fifth contact is configured to independently apply a voltage to the third gate electrode.

19. The semiconductor device of claim 1, wherein a top surface of the second channel layer is planar.

20. A semiconductor device comprising:
a first semiconductor transistor including a first source, a first drain, a first channel layer between the first source and the first drain, and a first gate stack covering the first channel layer and including a first dielectric layer and a first gate electrode; and
a second semiconductor transistor including a second source, a second drain, a second channel layer between the second source and the second drain and including a semiconductor material including a metal oxide, and a second gate stack covering the second channel layer and including a second dielectric layer and a second gate electrode,
wherein the second semiconductor transistor is on the first semiconductor transistor so that a top of the first gate stack underlaps the second gate stack by an amount greater than or equal to 90% of the second gate stack in cross-section,
wherein a ratio of an absolute value of a first drive current of the first semiconductor transistor to an absolute value of a second drive current of the second semiconductor transistor, is greater than or equal to 0.9 and less than or equal to 2.0,
wherein the second gate electrode of the second semiconductor transistor faces opposite to the first gate electrode, and is arranged on a rear side of the second dielectric layer and the second channel layer,
wherein the second gate electrode of the second semiconductor transistor faces opposite to the first gate electrode, and is arranged on a rear side of the second dielectric layer and the second channel layer,
wherein a dielectric constant of the second dielectric layer is greater than a dielectric constant of the first dielectric layer,
wherein an equivalent oxide thickness of the second dielectric layer is less than or equal to 0.75 times an equivalent oxide thickness of the first dielectric layer and is greater than or equal to 0.2 times the equivalent oxide thickness of the first dielectric layer, and
wherein a thickness of the second dielectric layer is less than a thickness of first dielectric layer.

21. The semiconductor device of claim 20, wherein at least one of,
   a width of the first semiconductor transistor is different from the width of the second semiconductor transistor,
   a length of the first semiconductor transistor is different from the length of the second semiconductor transistor,
   a mobility of majority carriers of the first semiconductor transistor is different than a mobility of majority carriers of the second semiconductor transistor, or
   a capacitance of the first dielectric layer is different than the capacitance of the second dielectric layer.

22. The semiconductor device of claim 20, wherein
   the first semiconductor transistor and the second semiconductor transistor are N-type transistors and have different channel widths, or
   the first semiconductor transistor and the second semiconductor transistor are P-type transistors and have different channel widths.

23. The semiconductor device of claim 20, wherein
   the first semiconductor transistor is an NMOS transistor having a first width, and
   the second semiconductor transistor is a PMOS transistor having a second width less than the first width.

24. The semiconductor device of claim 20, wherein the first semiconductor transistor is a pull-up transistor of an SRAM cell, and
   the second semiconductor transistor is a pull-down transistor of the SRAM cell.

\* \* \* \* \*